(12) United States Patent
Baek

(10) Patent No.: US 9,522,764 B2
(45) Date of Patent: Dec. 20, 2016

(54) PACKAGING APPARATUS FOR DEPOSITION MASKS

(71) Applicant: Samsung Display Co., Ltd., Yongin, Gyeonggi-Do (KR)

(72) Inventor: Daewon Baek, Yongin (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/741,245

(22) Filed: Jun. 16, 2015

(65) Prior Publication Data

US 2016/0101900 A1   Apr. 14, 2016

(30) Foreign Application Priority Data

Oct. 8, 2014  (KR) .......................... 10-2014-0135963

(51) Int. Cl.
  *B65D 25/10* (2006.01)
  *H01L 51/56* (2006.01)
  *H01L 51/00* (2006.01)

(52) U.S. Cl.
  CPC ........... *B65D 25/10* (2013.01); *H01L 51/0011* (2013.01); *Y10S 438/95* (2013.01)

(58) Field of Classification Search
  None
  See application file for complete search history.

(56) References Cited

U.S. PATENT DOCUMENTS 3,764,379 A * 10/1973 Tuttle ...................... H01L 21/00
                                              216/100
2003/0219936 A1* 11/2003 Kim ..................... H01L 21/2026
                                              438/166

FOREIGN PATENT DOCUMENTS

| JP | 2008-300097 A | 12/2008 |
| JP | 2013-124372 A | 6/2013 |
| KR | 1998-0086500 A | 12/1998 |
| KR | 10-2013-0088369 A | 8/2013 |

* cited by examiner

*Primary Examiner* — Angel Roman
(74) *Attorney, Agent, or Firm* — Knobbe Martens Olson & Bear LLP

(57) ABSTRACT

A packaging apparatus is provided for packaging one or more deposition masks. The apparatus comprises a base comprising a first surface and a first recess; a cover disposed over the base and comprising a second surface facing the first surface and a second recess; a first film placed over the first surface to cover the first recess; a second film placed over the second surface to cover the second recess; and a plurality of insertion sheets interposed between the first film and the second film. The one or more deposition masks comprise a first mask interposed between first and second insertion sheets, the first mask having a width defining a width direction. Each of the first and second insertion sheets comprises a plurality of openings, each extending along the width direction when viewed in a viewing direction perpendicular to the first surface.

20 Claims, 5 Drawing Sheets ical application claims the benefit of Korean Patent
PACKAGING APPARATUS FOR DEPOSITION MASKS

RELATED APPLICATION

This application claims the benefit of Korean Patent Application No. 10-2014-0135963, filed on Oct. 8, 2014, in the Korean Intellectual Property Office, the disclosure of which is incorporated herein in its entirety by reference.

BACKGROUND

1. Field

One or more embodiments relate to a packaging apparatus for deposition masks.

2. Description of the Related Art

An organic light-emitting display device generates an image as light emission occurs due to recombination of holes and electrons injected from an anode and a cathode in an emission layer. The organic light-emitting display device has a stack structure in which the emission layer is interposed between the anode and the cathode. However, light emission achieved by using this structure has low efficiency, and thus, a structure including an emission layer between the anode and cathode, and an electron injection layer, an electron transport layer, a hole transport layer, or a hole injection layer selectively added on the emission layer has been proposed.

The electrodes (anode and cathode) and the intermediate (emission) layer of the organic light-emitting display device may be formed by various methods, one of which is a deposition method. In this case, a deposition mask having the same pattern as a thin-film pattern to be formed on a substrate is aligned on the substrate, and a thin film having a desired pattern is formed by depositing an original material of the thin film on the substrate through the deposition mask.

Information disclosed in this Background section had been already known to the inventors before achieving the present inventive concept or is technical information acquired in the process of achieving the present inventive concept. Therefore, this information may not include the prior art that had been already known to the public in this country.

SUMMARY

One or more embodiments include a mask packaging apparatus.

Additional aspects will be set forth in part in the description which follows and, in part, will be apparent from the description, or may be learned by practice of the presented embodiments.

One aspect of the invention provides a packaging apparatus for packaging one or more deposition masks having slits through which a deposition material passes, the apparatus comprising: a base comprising a first surface and a first recess recessed from the first surface; a cover disposed over the base and comprising a second surface facing the first surface and a second recess recessed from the second surface; a first film placed over the first surface to cover the first recess; a second film placed over the second surface to cover the second recess; and a plurality of insertion sheets interposed between the first film and the second film, wherein the one or more deposition masks comprises a first mask interposed between a first one and a second one of the plurality of insertion sheets, the first mask having a width defining a width direction, wherein each of the first and second insertion sheets comprising a plurality of openings, each extending along the width direction when viewed in a viewing direction perpendicular to the first surface.

In the foregoing apparatus, the first film may have a predetermined elastic force and supports the one or more masks to inhibit the one or more masks from being at least partly inserted in the first recess. The second film may have a predetermined elastic force and supports the one or more masks to inhibit the one or more masks from being at least partly inserted in the second recess. The apparatus may further comprise a connection member which connects the base and the cover, wherein the connection member is hingedly attached to the base and the cover such that the base, the connection member and the cover together form a folder. The plurality of insertion sheets may be formed of polyethylene (PE), polypropylene (PP), or polyethylene terephthalate (PET). Each of the plurality of openings of the first and second insertion sheets may comprise one end that does not overlap the first mask when viewed in the viewing direction.

Still in the foregoing apparatus, the plurality of openings may be arranged along a length of the first mask, and each of the plurality of openings may have a width of about 0.1 mm to about 10 mm measured in a direction along the length of the first mask. Each of the plurality of openings may have a polygonal shape when viewed in the viewing direction. Each of the plurality of openings may have a round end when viewed in the viewing direction. Each of the plurality of openings may have an oval shape.

Yet in the foregoing apparatus, the plurality of openings may comprise a plurality of pairs of openings which are arranged along a length of the first mask, each pair comprises a first opening and a second opening aligned along an imaginary line extending along the width direction, wherein each of the plurality of openings comprises a first end overlapping the first mask when viewed in the viewing direction and a second end not overlapping the first mask when viewed in the viewing direction. The first opening and the second opening are separated by a partition part having a width of about 0.1 mm to about 10 mm. When viewed in the viewing direction, the partition part may comprise an edge slanted with respect to the width direction with an angle greater than 0° and less than 90°.

Further in the foregoing apparatus, a length of the plurality of openings may be equal to or greater than the width of the first mask. The plurality of openings may be arranged along a length of the first mask by a substantially constant distance. The first mask may comprise a plurality of deposition patterns and at least one bridge disposed between immediately neighboring two of the plurality of deposition patterns, wherein the at least one bridge overlaps at least one of the plurality of openings when viewed in the viewing direction. The first mask may comprise a plurality of deposition patterns and at least one bridge disposed between immediately neighboring two of the plurality of deposition patterns, wherein each deposition pattern overlaps at least one of the plurality of openings when viewed in the viewing direction. The first mask may contact the first and second insertion sheets.

Another aspect of the invention provides a method of making an organic light emitting display device, the method comprising: providing the foregoing packaging apparatus; retrieving the first mask from the packaging apparatus; placing the first mask between a substrate and a deposition source containing a deposition material; and depositing the deposition material over the substrate through the slits of the first mask, thereby making an organic light emitting display device. In the foregoing method, each of the plurality of openings of the first and second insertion sheets may comprise one end that does not overlap the first mask when viewed in the viewing direction.

According to one or more embodiments, a packaging apparatus for packaging one or more deposition masks having slits through which a deposition material passes includes: a bottom part having a first groove; a cover part having a second groove and covering the bottom part; a first film covering the first groove; a second film covering the second groove; a connection part connecting the bottom part and the cover part; and a plurality of intermediate members interposed between the first film and the second film and having a plurality of openings extending in a width direction of the one or more masks.

The first film may have a predetermined elastic force and support the one or more masks to prevent deformation thereof in a height direction thereof.

The second film may have a predetermined elastic force and may support the one or more masks to prevent deformation of the one or more masks.

The connection part may have a hinge shape.

The plurality of intermediate members may be formed of polyethylene (PE), polypropylene (PP), or polyethylene terephthalate (PET).

The one or more masks may be interposed between the plurality of intermediate members.

The plurality of openings may have a width of about 0.1 mm to about 10 mm.

The plurality of openings may be formed to have a polygonal shape.

One or more edges of the plurality of openings may have a predetermined curvature.

The plurality of openings may have an oval shape.

Each of the plurality of openings may include one or more partition parts in a width direction thereof.

The one or more partition parts may have a width of about 0.1 mm to about 10 mm.

The plurality of openings and the one or more partition parts may make an angle greater than 0° and less than 90°.

A length of the plurality of openings may be equal to or greater than a width of the one or more masks.

The plurality of openings may be spaced from each other by a constant distance.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
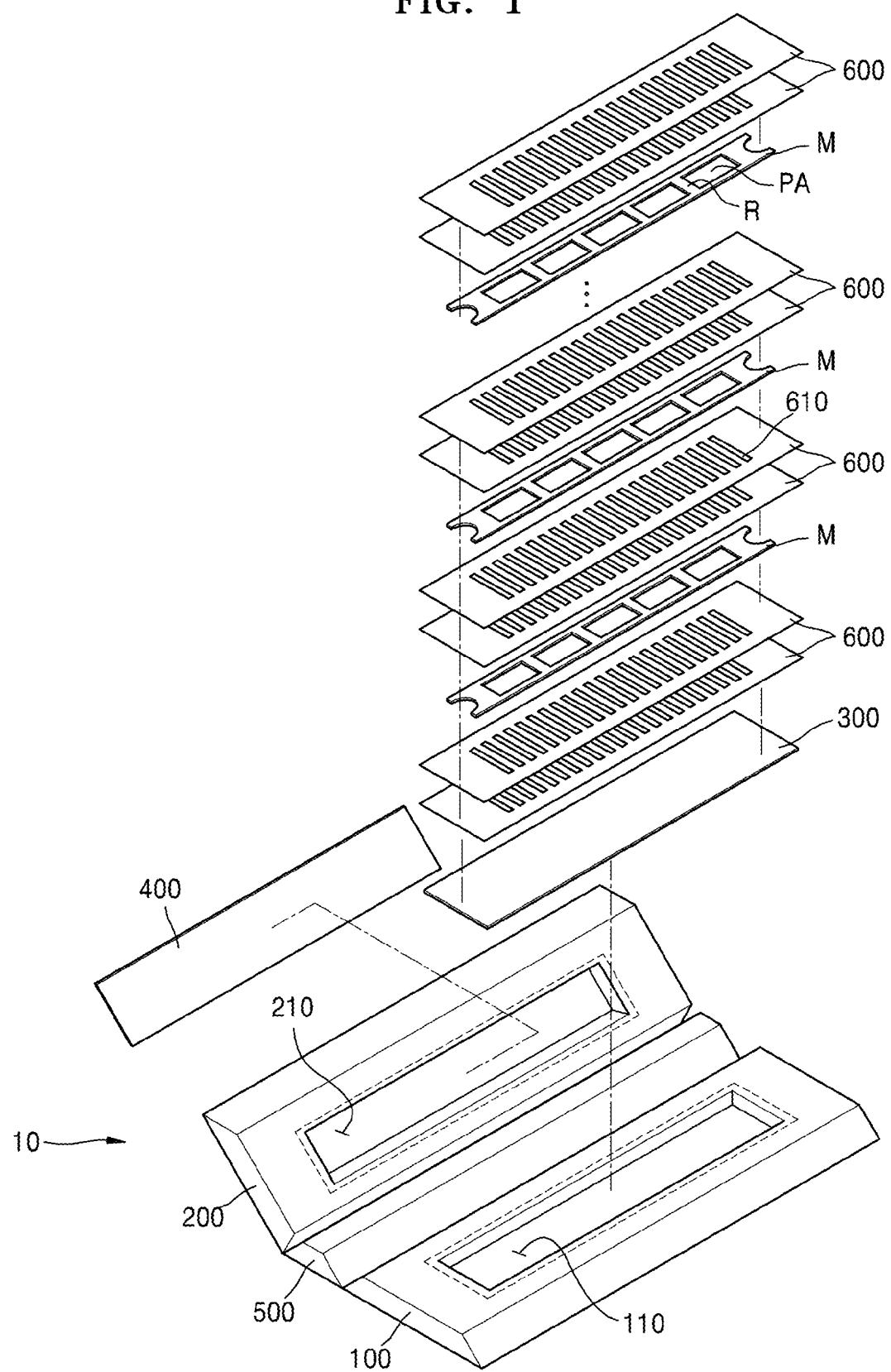
FIG. 1 is a schematic exploded perspective view of a packaging apparatus according to an embodiment of the inventive concept.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. It will be understood that although the terms "first", "second", etc. may be used herein to describe various components, these components should not be limited by these terms. These components are only used to distinguish one component from another. As used herein, the singular forms "a," "an" and "the" are intended to include the plural forms as well, unless the context clearly indicates otherwise. It will be further understood that the terms "comprises" and/or "comprising" used herein specify the presence of stated features or components, but do not preclude the presence or addition of one or more other features or components.

Sizes of elements in the drawings may be exaggerated for convenience of explanation. In other words, since sizes and thicknesses of components in the drawings are arbitrarily illustrated for convenience of explanation, the following embodiments are not limited thereto. When a certain embodiment may be implemented differently, a specific process order may be performed differently from the described order. For example, two consecutively described processes may be performed substantially at the same time or performed in an order opposite to the described order.

The inventive concept will now be described more fully with reference to the accompanying drawings, in which embodiments of the inventive concept are shown. Like reference numerals in the drawings denote like elements, and thus their repetitive description will be omitted.

To deposit a precise pattern on a substrate during the manufacturing process of a display device, for example, an organic light emitting display device, it is important to minimize or avoid contamination or deformation of a deposition mask by foreign substances or an external shock during manufacturing, transportation, and storage of the deposition mask. In addition, in view of the small thickness of the deposition mask, it is desirable to protect the deposition mask from heat deflection due to temperature changes.

FIG. 1 is a schematic exploded perspective view of a packaging apparatus 10 for deposition masks, according to an embodiment of the inventive concept.

Referring to FIG. 1, the packaging apparatus 10 includes a bottom part or base 100, a cover part 200, a first film 300, a second film 400, a connection part 500, and intermediate members or insertion sheets 600.

In detail, the bottom part 100 includes a first groove or recess 110 and supports the first film 300, a plurality of intermediate members or insertion sheets 600, and a plurality of masks M sequentially disposed over the first groove 110. The first groove 110 can minimize or reduce deformation of the plurality of masks M due to a shock applied to the packaging apparatus 10 during transportation of the plurality of masks M and has a shorter length than the plurality of masks M. Accordingly, the first film 300 may be seated around the first groove 110, and the plurality of masks M and the plurality of intermediate members 600 may be sequentially disposed on the first film 300.

The first film 300 is seated on the first groove 110 to cover the first groove 110 and has a predetermined elastic force so as to minimize or reduce deformation of each mask M in a thickness direction thereof. In general, a length of the first groove 110 is less than a length of the mask M, and thus, if the mask M is bent due to a force applied in the thickness direction of the mask M, the mask M may fall in the first groove 110.

If the mask M falls in the first groove 110, since the length of the mask M is greater than the length of the first groove 110, the mask M fallen in the first groove 110 is stuck in the first groove 110, and thus, permanent deformation of the mask M may occur if the mask M is stuck in the first groove 110 for a long time.

As the first film 300 has the predetermined elastic force and is interposed between the first groove 110 and the mask M, the first film 300 may provide a restoring force to the mask M so that the original shape of the mask M remains the same even though the mask M is bent due to a force applied in the thickness direction thereof. Therefore, by disposing the first film 300 to cover the first groove 110 and to support the mask M, the mask M may be protected from falling in the first groove 110 and having a permanently deformed shape.

Next, the cover part 200 includes a second groove or recess 210 and covers the bottom part 100, and the first film 300, the plurality of intermediate members 600, the plurality of masks M, and the second film 400 sequentially disposed on the bottom part 100. Like the first groove 110, the second groove 210 can minimize or reduce deformation of the plurality of masks M due to a shock applied to the packaging apparatus 10 during transportation of the plurality of masks M.

In addition, the second groove 210 has a shorter length than each mask M such that the second film 400 is seated around the second groove 210, and the second film 400 covers the uppermost intermediate member 600 when the cover part 200 covers the bottom part 100, the first film 300 and a stack structure of one or more masks M and intermediate members 600.

The second film 400 is seated in contact with the second groove 210 to cover the second groove 210 and has a predetermined elastic force so as to minimize or reduce deformation of each mask M in the thickness direction thereof. In this case, when the cover part 200 covers the bottom part 100, the cover part 200 and the bottom part 100 are disposed such that the cover part 200 and the bottom part 100 face each other, and thus, the second film 400 is disposed below the second groove 210 and is interposed between the second groove 210 and the uppermost intermediate member 600.

In general, a length of the second groove 210 is less than the length of the mask M, and thus, if the mask M is bent due to a force in the thickness direction thereof, the mask M may fall in the second groove 210.

If the mask M falls in the second groove 210, since the length of the mask M is greater than the length of the second groove 210, the mask M fallen in the second groove 210 is stuck into the second groove 210, and thus, a permanent deformation of the mask M may occur if the mask M remains stuck in the groove 210 for a long time.

The second film 400 has the predetermined elastic force and is interposed between the second groove 210 and the mask M, and thus, the second film 400 may provide a restoring force to the mask M so that the original shape of the mask M is maintained even though the mask M is bent due to a force applied in the thickness direction thereof. Therefore, by disposing the second film 400 to cover the second groove 210 and to support the mask M, the mask M may be prevented from falling in the second groove 210 and having a permanently deformed shape.

The packaging apparatus 10 also includes the connection part 500 connecting the bottom part 100 and the cover part 200. The connection part 500 connects the bottom part 100 and the cover part 200 so that the bottom part 100 and the cover part 200 rotatably move around the connection part 500 between an area where the first groove 110 and the second groove 210 respectively formed in the bottom part 100 and the cover part 200 face each other (refer to FIG. 6) and an area where the first groove 110 and the second groove 210 do not face each other (refer to FIG. 1).

Figure 6:
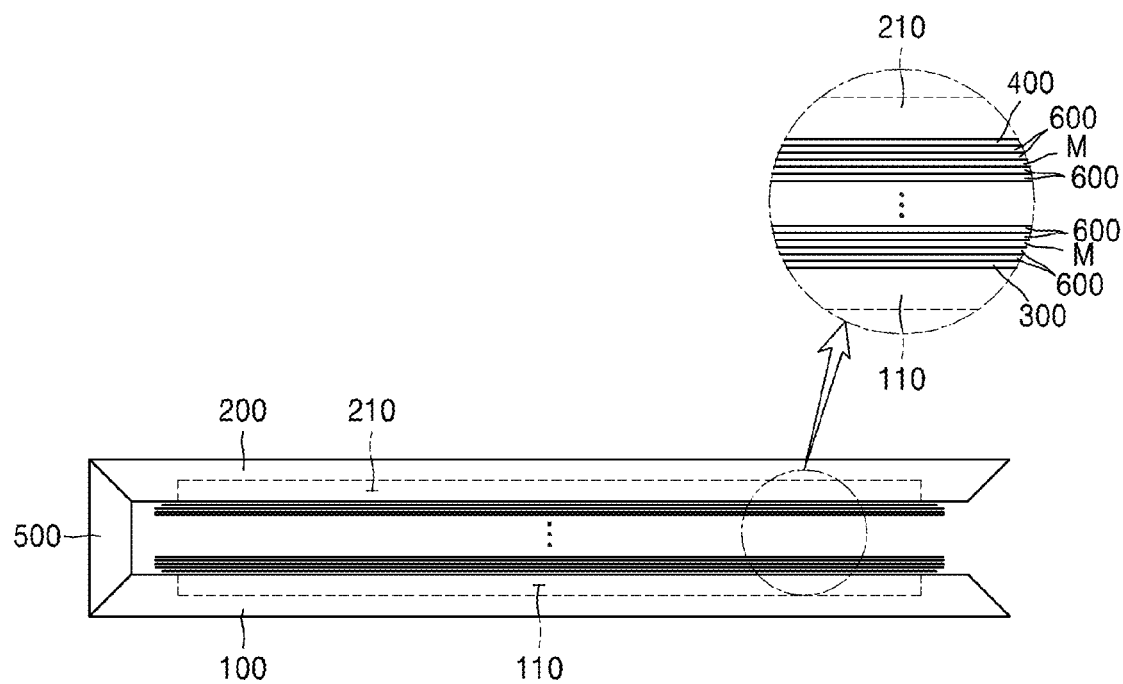
FIG. 6 is a side view and a partial magnified view of the packaging apparatus of FIG. 1, according to an embodiment of the inventive concept.

According to FIGS. 1 and 6, the connection part 500 has a trapezoidal cross-section, but this is merely for corresponding to shapes of the bottom part 100 and the cover part 200. For example, the connection part 500 may have a hinge shape like a hinge connecting a door and a door frame or have any shape as long as the connection part 500 holds and connects the bottom part 100 and the cover part 200 such that the bottom part 100 and the cover part 200 rotatably move with respect to each other. In embodiments, the connecting part, base part and cover part form a folder-shaped packaging device.

Next, the packaging apparatus 10 also includes the plurality of intermediate members 600. The plurality of intermediate members 600 may be formed of polyethylene (PE), polypropylene (PP), or polyethylene terephthalate (PET).

PE, PP, and PET used as a material for the plurality of intermediate members 600 are thermoplastic materials and have a thermal expansion coefficient 60 times greater than that of an invar alloy, which is a general material for forming the plurality of masks M. Therefore, when the plurality of intermediate members 600 and the plurality of masks M are packed in a contact state at a normal temperature and are exposed thereafter in a low-temperature environment, the plurality of masks M manufactured in a thin-plate shape contract along with the plurality of intermediate members 600 which easily contract due to a temperature drop.

This phenomenon usually occurs when the plurality of masks M are packed and transported in winter when the air temperature is low. When the packaging apparatus 10 exposed to external air at a low temperature is stored again in a warehouse at a normal temperature, the plurality of intermediate members 600 made of thermoplastic having a large thermal expansion coefficient are plastic-deformed again and expand to the shape before contraction. However, the plurality of masks M made of an invar alloy are not plastic-deformed and continuously remain in the contracted shape due to the previous temperature drop, and as a result, wrinkles are generated on the plurality of masks M, thereby causing defective masks M.

To address this problem, in the present embodiment, an opening 610 is formed in each intermediate member 600 to compensate for thermal deformation of the intermediate member 600. The opening 610 will be described in detail below.

Referring back to FIG. 1, a mask M is interposed between a plurality of intermediate members 600, and a stack body including the mask M and the plurality of intermediate members 600 is repeatedly stacked several times. Therefore, a plurality of masks M may be disposed between the bottom part 100 and the cover part 200 of the mask packaging apparatus 10, but the present embodiment is not limited thereto, and only one mask M may be packed in the mask packaging apparatus 10.

In addition, although FIG. 1 shows that two intermediate members 600 are disposed between the plurality of masks M interposed between the first film 300 and the second film 400, the present embodiment is not limited thereto, and one intermediate member 600 or three or more intermediate members 600 may be disposed between the plurality of masks M, between the first film 300 and one mask M, and between the second film 400 and one mask M.

Next, the opening 610 and a partition part 620 formed in each intermediate member 600 will be described with reference to FIGS. 2A to 2D, 3A, and 3B.

Figure 2A:
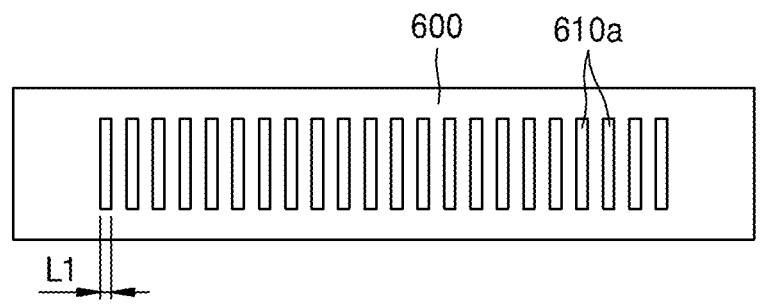
FIGS. 2A to 2D are top views of examples of an intermediate member of the packaging apparatus of FIG. 1, according to embodiments of the inventive concept.
Figure 2B:
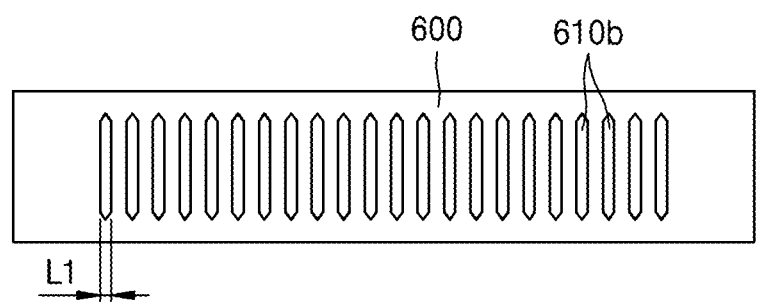
Figure 2C:
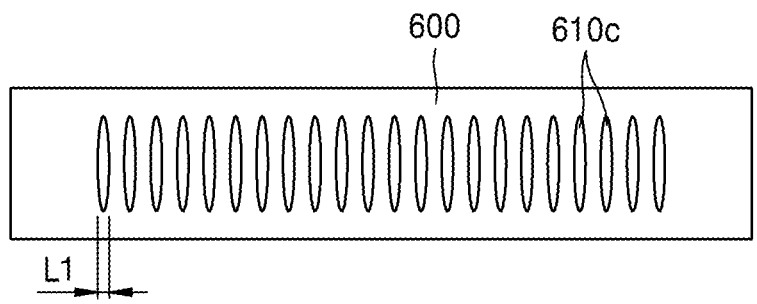
Figure 2D:
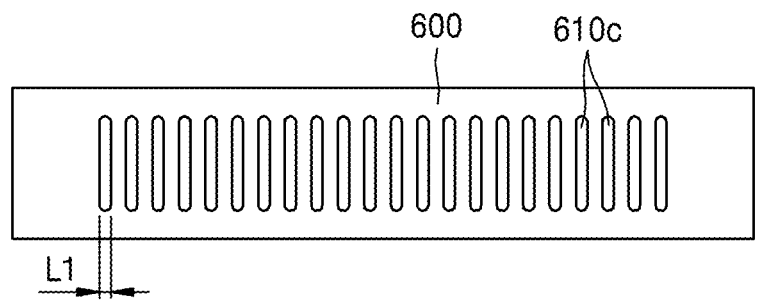
Figure 3A:
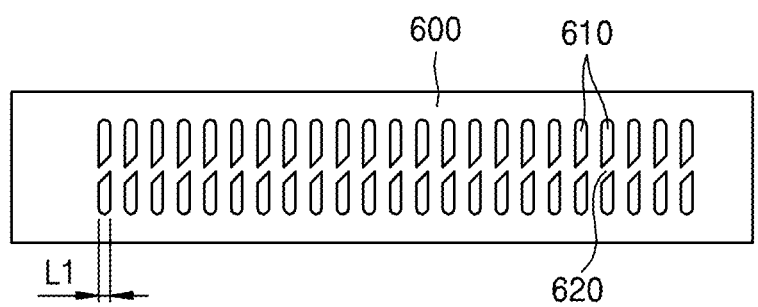
FIGS. 3A and 3B are top views of examples of an intermediate member of the packaging apparatus of FIG. 1, according to other embodiments of the inventive concept.
Figure 3B:
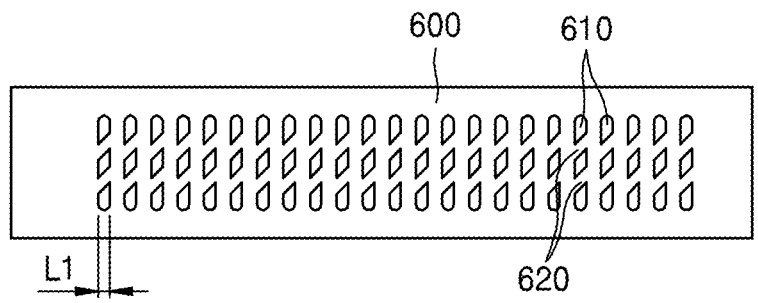

FIGS. 2A to 2D are top views of modification examples of the intermediate member 600 of FIG. 1, according to embodiments of the inventive concept, and FIGS. 3A and 3B are top views of modification examples of the intermediate member 600 of FIG. 1, according to other embodiments of the inventive concept.

The intermediate member 600 may include a plurality of openings 610 extending in a width direction of the mask M. Herein, the plurality of openings 610 may be formed in a polygonal shape or an oval shape. For example, the plurality of openings 610 may be formed in a rectangular shape as shown by reference numeral 610a in FIG. 2A, in a hexagonal shape as shown by reference numeral 610b in FIG. 2B, or in an oval shape as shown as reference numeral 610c in FIG. 2C. Alternatively, one or more of edges of the plurality of openings 610 may be formed to have a predetermined curvature. For example, FIG. 2D shows that both ends of each of the plurality of openings 610 are curved.

In detail, the plurality of openings 610 may be formed to be spaced apart from each other by a predetermined distance as shown in FIGS. 2A to 2D, but the present embodiment is not limited thereto, and the plurality of openings 610 may be formed to be spaced apart from each other by different distances.

Each opening 610 is formed to have a width of about 0.1 mm to about 10 mm. Reference L1 denotes the width of the opening 610. The reason why the opening 610 is formed to have a width of about 0.1 mm to about 10 mm is presented below.

As described above, the plurality of openings 610 are formed in the intermediate member 600 to minimize or reduce the occurrence of wrinkles in the mask M due to thermal deformation of the intermediate member 600. To achieve this purpose, the width of the opening 610 may be adjusted. If the width of the opening 610 is unnecessarily large, a rib R between pattern areas PA formed on the mask M may be inserted into the opening 610, and accordingly, the mask M may be permanently deformed. On the contrary, if the width of the opening 610 is unnecessarily small, the opening 610 cannot sufficiently compensate for thermal deformation of the intermediate member 600. Therefore, the opening 610 may be formed to have a width of about 0.1 mm to about 10 mm in order to minimize or reduce the formation of wrinkles in the mask M due to thermal deformation of the intermediate member 600, by sufficiently compensating for the thermal deformation of the intermediate member 600.

In more detail, the plurality of openings 610 may include one or more partition parts 620 formed in a length direction of the plurality of openings 610. As shown in FIG. 3A, one partition part 620 is formed in each opening 610, and as shown in FIG. 3B, two partition parts 620 are formed in each opening 610.

Figure 4:
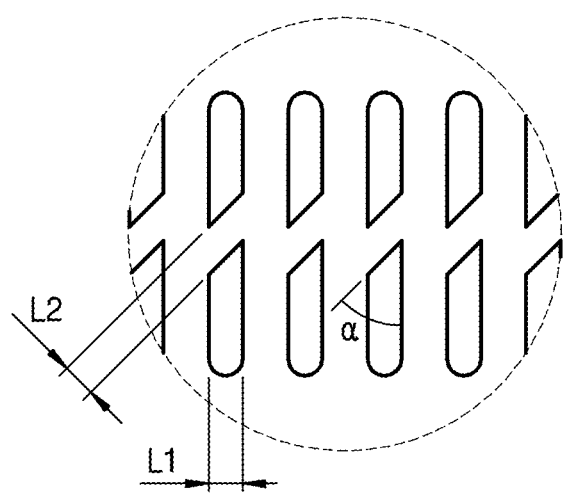
FIG. 4 is a partial magnified view of the intermediate member of FIG. 3A.

FIG. 4 is a partial magnified view of the intermediate member 600 of FIG. 3A.

Referring to FIG. 4, reference L1 denotes the width of the opening 610, and reference L2 denotes a width of the partition part 620. As described above, the width L1 of the opening 610 may be about 0.1 mm to about 10 mm, and the width L2 of the partition part 620 may also be about 0.1 mm to about 10 mm.

Next, reference α denotes an angle between the opening 610 and the partition part 620. The opening 610 and the partition part 620 may be formed to make an angle greater than 0° and less than 90°. In one embodiment, the angle may be about 10°, about 20°, about 25°, about 30°, about 35°, about 40°, about 45°, about 55° or about 70°. In another embodiment, the angle may be a value between two of above angle values.

Figure 5:
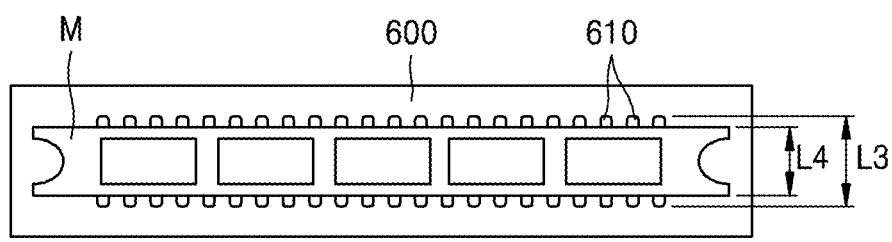
FIG. 5 is a top view of a mask and an intermediate member of the packaging apparatus of FIG. 1, according to an embodiment of the inventive concept.

FIG. 5 is a top view of the mask M and the intermediate member 600 of FIG. 1, according to an embodiment of the inventive concept.

Referring to FIG. 5, a length L3 of the opening 610 is equal to or greater than a width L4 of the mask M. FIG. 5 shows that the length L3 of the opening 610 is greater than the width L4 of the mask M.

The reason why the length L3 of the opening 610 is formed to be equal to or greater than the width L4 of the mask M is to further minimize or reduce the occurrence of wrinkles in the mask M due to thermal deformation of the intermediate member 600 by sufficiently compensating for thermal deformation of the intermediate member 600. If the length L3 of the opening 610 is less than the width L4 of the mask M, when the intermediate member 600 contracts or expands due to thermal deformation, wrinkles may occur in the mask M in an edge of the mask M, i.e., a region where the opening 610 does not exist.

Therefore, to further minimize or reduce the occurrence of wrinkles due to a residual stress applied to the mask M while the intermediate member 600 contracts or expands due to thermal deformation, the length L3 of the opening 610 may be at least equal to or greater than the width L4 of the mask M.

A state where a plurality of masks M are packed along with a plurality of intermediate members 600, the first film 300, and the second film 400 in the packaging apparatus 10 of FIG. 1 and the bottom part 100 is covered with the cover part 200 will now be described with reference to FIG. 6.

FIG. 6 is a side view and a partial magnified view of the packaging apparatus 10 of FIG. 1, according to an embodiment of the inventive concept.

The bottom part 100 is disposed at the lowest side. The first film 300 is disposed on the bottom part 100 such that the first film 300 covers the first groove 110 formed in the bottom part 100, and a plurality of intermediate members 600 (two in FIG. 6) are disposed on the first film 300. Herein each of the intermediate members 600 includes the openings 610 as shown in FIGS. 1 to 5 and the partition part(s) 620 as shown in FIGS. 3A to 4. After the plurality of intermediate members 600 are disposed on the first film 300, a mask M is disposed on the plurality of intermediate members 600. A plurality of intermediate members 600 (two in FIG. 6) are disposed on the mask M again, and a mask M and a plurality of intermediate members 600 are disposed thereon again, such that the intermediate members 600 covers each mask M from the top and bottom of the mask M and protects the mask M from an external shock.

The mask M is interposed between the intermediate members 600 according to the arrangement described above, and up to ten masks M may be sequentially disposed and packed in the mask packaging apparatus 10.

As described above, according to the one or more of the above embodiments, a packaging apparatus for deposition masks may minimize heat deflection of the deposition masks which may occur during transportation and storage of the deposition masks.

It should be understood that the embodiments described therein should be considered in a descriptive sense only and not for purposes of limitation. Descriptions of features or aspects within each embodiment should typically be considered as available for other similar features or aspects in other embodiments.

While one or more embodiments have been described with reference to the appended figures, it will be understood by those of ordinary skill in the art that various changes in form and details may be made therein without departing from the spirit and scope as defined by the following claims.

What is claimed is:

1. A packaging apparatus for packaging one or more deposition masks having slits through which a deposition material passes, the apparatus comprising:
   a base comprising a first surface and a first recess recessed from the first surface;
   a cover disposed over the base and comprising a second surface facing the first surface and a second recess recessed from the second surface;
   a first film placed over the first surface to cover the first recess;
   a second film placed over the second surface to cover the second recess; and
      a plurality of insertion sheets interposed between the first film and the second film,
   wherein the one or more deposition masks comprises a first mask interposed between a first one and a second one of the plurality of insertion sheets, the first mask having a width defining a width direction,
   wherein each of the first and second insertion sheets comprising a plurality of openings, each extending along the width direction when viewed in a viewing direction perpendicular to the first surface.

2. The apparatus of claim 1, wherein the first film has a predetermined elastic force and supports the one or more masks to inhibit the one or more masks from being at least partly inserted in the first recess.

3. The apparatus of claim 1, wherein the second film has a predetermined elastic force and supports the one or more masks to inhibit the one or more masks from being at least partly inserted in the second recess.

4. The apparatus of claim 1, further comprising a connection member which connects the base and the cover, wherein the connection member is hingedly attached to the base and the cover such that the base, the connection member and the cover together form a folder.

5. The apparatus of claim 1, wherein the plurality of insertion sheets are formed of polyethylene (PE), polypropylene (PP), or polyethylene terephthalate (PET).

6. The apparatus of claim 1, wherein each of the plurality of openings of the first and second insertion sheets comprises one end that does not overlap the first mask when viewed in the viewing direction.

7. The apparatus of claim 1, wherein the plurality of openings are arranged along a length of the first mask, and each of the plurality of openings has a width of about 0.1 mm to about 10 mm measured in a direction along the length of the first mask.

8. The apparatus of claim 1, wherein each of the plurality of openings has a polygonal shape when viewed in the viewing direction.

9. The apparatus of claim 1, wherein each of the plurality of openings has a round end when viewed in the viewing direction.

10. The apparatus of claim 1, wherein each of the plurality of openings has an oval shape.

11. The apparatus of claim 1, wherein the plurality of openings comprises a plurality of pairs of openings which are arranged along a length of the first mask, each pair comprises a first opening and a second opening aligned along an imaginary line extending along the width direction, wherein each of the plurality of openings comprises a first end overlapping the first mask when viewed in the viewing direction and a second end not overlapping the first mask when viewed in the viewing direction.

12. The apparatus of claim 11, wherein the first opening and the second opening are separated by a partition part having a width of about 0.1 mm to about 10 mm.

13. The apparatus of claim 11, wherein, when viewed in the viewing direction, the partition part comprises an edge slanted with respect to the width direction with an angle greater than 0° and less than 90°.

14. The apparatus of claim 1, wherein a length of the plurality of openings is equal to or greater than the width of the first mask.

15. The apparatus of claim 1, wherein the plurality of openings are arranged along a length of the first mask by a substantially constant distance.

16. The apparatus of claim 1, wherein the first mask comprises a plurality of deposition patterns and at least one bridge disposed between immediately neighboring two of the plurality of deposition patterns, wherein the at least one bridge overlaps at least one of the plurality of openings when viewed in the viewing direction.

17. The apparatus of claim 1, wherein the first mask comprises a plurality of deposition patterns and at least one bridge disposed between immediately neighboring two of the plurality of deposition patterns, wherein each deposition pattern overlaps at least one of the plurality of openings when viewed in the viewing direction.

18. The apparatus of claim 1, wherein the first mask contacts the first and second insertion sheets.

19. A method of making an organic light emitting display device, the method comprising:
   providing the packaging apparatus of claim 1;
   retrieving the first mask from the packaging apparatus;
   placing the first mask between a substrate and a deposition source containing a deposition material; and
   depositing the deposition material over the substrate through the slits of the first mask, thereby making an organic light emitting display device.

20. The method of claim 19, wherein each of the plurality of openings of the first and second insertion sheets comprises one end that does not overlap the first mask when viewed in the viewing direction.

* * * * *